(12) United States Patent
Ojima et al.

(10) Patent No.: US 12,339,409 B2
(45) Date of Patent: Jun. 24, 2025

(54) RADIATION IMAGING APPARATUS AND RADIATION IMAGING SYSTEM

(71) Applicant: CANON KABUSHIKI KAISHA, Tokyo (JP)

(72) Inventors: Tetsunori Ojima, Kanagawa (JP); Minoru Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 300 days.

(21) Appl. No.: 18/189,880

(22) Filed: Mar. 24, 2023

(65) Prior Publication Data

US 2023/0314637 A1 Oct. 5, 2023

(30) Foreign Application Priority Data

Mar. 30, 2022 (JP) ................. 2022-056593

(51) Int. Cl.
*G01T 1/24* (2006.01)

(52) U.S. Cl.
CPC ................... *G01T 1/247* (2013.01)

(58) Field of Classification Search
None
See application file for complete search history.

(56) References Cited

U.S. PATENT DOCUMENTS

| | | | |
|---|---|---|---|
| 2008/0029768 A1* | 2/2008 | Asano | H10K 59/121 257/72 |
| 2010/0295143 A1* | 11/2010 | Yokogawa | H10F 39/806 257/435 |
| 2020/0163233 A1* | 5/2020 | Brackley | H05K 5/30 |
| 2021/0141105 A1* | 5/2021 | Ofuji | H04N 25/617 |

FOREIGN PATENT DOCUMENTS

| | | |
|---|---|---|
| EP | 0984316 A2 | 3/2000 |
| EP | 3823268 A1 | 5/2021 |
| JP | 2021078050 A | 5/2021 |

* cited by examiner

*Primary Examiner* — Edwin C Gunberg
(74) *Attorney, Agent, or Firm* — Canon U.S.A., Inc. IP Division

(57) ABSTRACT

A radiation imaging apparatus includes a first pixel set and a second pixel set that are adjacently arranged in a predetermined direction, and each of the first pixel set and the second pixel set includes two or more of pixels which are adjacently arranged in the predetermined direction and in which photoelectric conversion elements have aperture portions having different shapes. In the pixels included in the first pixel set and the second pixel set, distances between gravity centers or centers of the aperture portions of the adjacent pixels are substantially the same.

12 Claims, 7 Drawing Sheets

RADIATION IMAGING APPARATUS AND RADIATION IMAGING SYSTEM

BACKGROUND

Field

The present disclosure relates to a radiation imaging apparatus and a radiation imaging system.

Description of the Related Art

Radiation imaging apparatuses each including pixels arranged in a two-dimensional matrix and using a flat panel detector (FPD) connected to a drive circuit and a readout circuit are widely used. The pixel includes a photoelectric conversion element and a switch element. The drive circuit and the readout circuit are used to drive a pixel to read out a signal.

An integrated circuit (IC) chip to be used in the readout circuit is costly since an analog amplifier and an analog-to-digital (A/D) converter are integrated at a high density. A proportion of the IC chip cost in component cost of the radiation imaging apparatus is high.

Japanese Patent Application Laid-Open No. 2021-78050 discusses signal line sharing in which a signal line for outputting signals is shared by two pixels adjacent to each other. Such signal line sharing can reduce cost of an IC chip to be used in a readout circuit connected to the signal line.

In the radiation imaging apparatus discussed in Japanese Patent Application Laid-Open No. 2021-78050, a pixel set that is a set of two pixels having different structures is periodically repeated in the same row in which the pixels are arranged. In such arrangement, there are two types of distances: a distance between gravity centers of respective pixel apertures each including a photoelectric conversion layer and a shield layer for the photoelectric conversion layer; and a distance between centers of respective pixel apertures. As a result, the arrangement has a period in which the gravity centers or the centers of the pixel apertures are equally spaced apart on an every-other-pixel basis.

In a case where an image is captured using grids with respect to such a radiation imaging apparatus, complex moire occurs in the captured image due to a period in which gravity centers or centers of pixel apertures are equally spaced apart on an every-other-pixel basis. An increase in complexity of moire hinders removal of the moire by image processing. Consequently, image quality may be degraded.

SUMMARY

The aforementioned issues are solved by a radiation imaging apparatus that includes a pixel unit in which a plurality of pixels each including a photoelectric conversion element configured to convert light into an electric charge and a switch element is arranged in a matrix. The pixel unit includes a first pixel set and a second pixel set that are adjacently arranged in a predetermined direction, and each of the first pixel set and the second pixel set includes two or more of the pixels which are adjacently arranged in the predetermined direction and in which the photoelectric conversion elements have aperture portions having different shapes. Each of the aperture portions has a gravity center or center, and a distance between each of the gravity centers or the centers for adjacent pixels in the pixels are substantially the same.

Further features of the present disclosure will become apparent from the following description of embodiments with reference to the attached drawings.

DESCRIPTION OF THE EMBODIMENTS

Embodiments of the present disclosure are described with reference to the drawings. In the present specification, radiation includes an α-ray, a β-ray, and a γ-ray each of which is a beam created by a particle (including a photon) released by radioactive decay. The radiation also includes a beam, for example, an X-ray, a particle ray, and a cosmic ray. Such a beam has an energy substantially greater than or equal to that of the beam created by a particle released by radioactive decay. Each of the embodiments of the present invention described below can be implemented solely or as a combination of a plurality of the embodiments or features thereof where necessary or where the combination of elements or features from individual embodiments in a single embodiment is beneficial.

Figure 1:
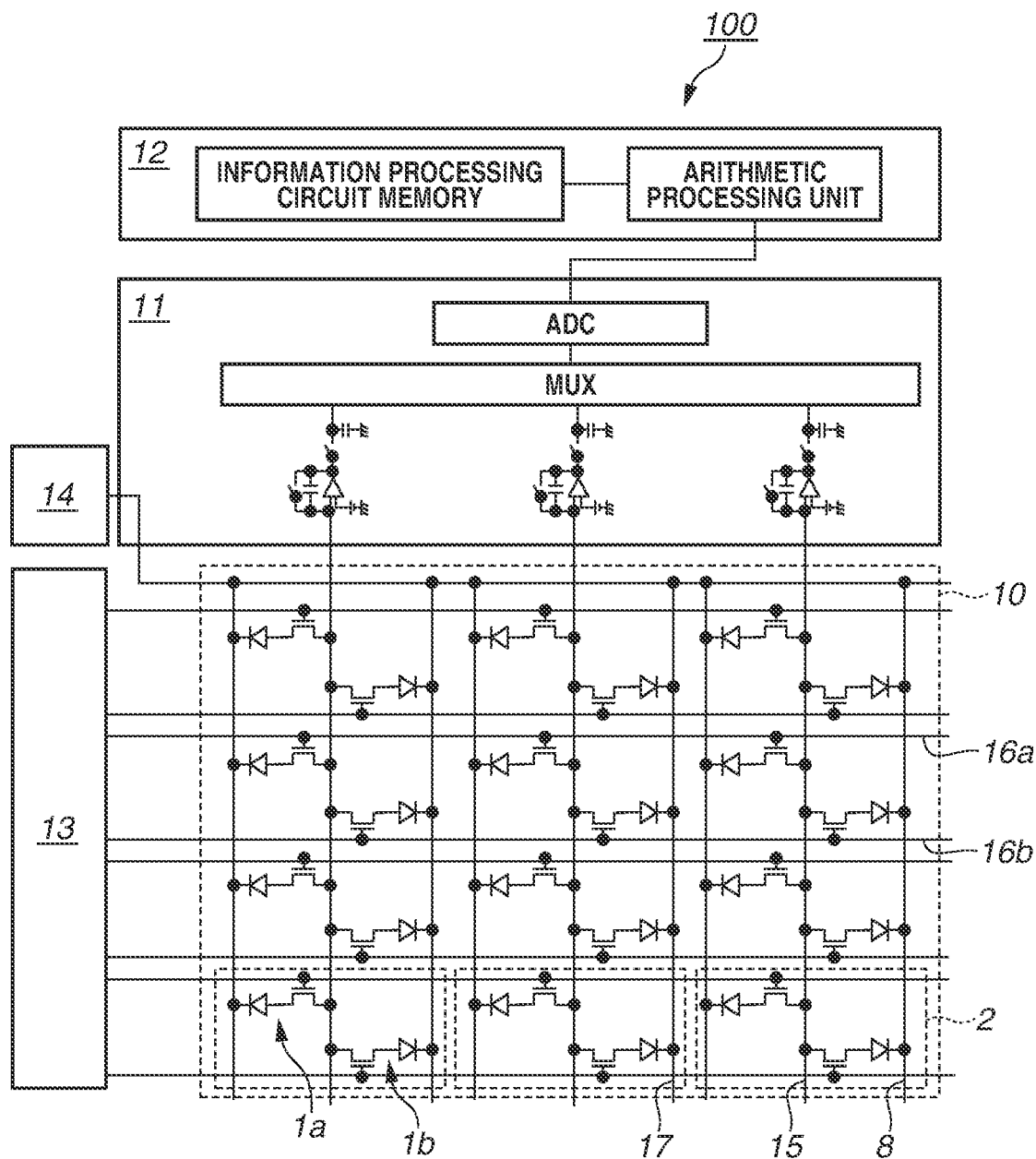
FIG. 1 is an equivalent circuit diagram illustrating circuit arrangement of a radiation imaging apparatus according to a first embodiment.

FIG. 1 is an equivalent circuit diagram illustrating circuit arrangement of a radiation imaging apparatus 100 according to a first embodiment of the present disclosure. The radiation imaging apparatus 100 in the present embodiment includes a pixel unit 10 in which a plurality of pixels 1 is arranged in a matrix on a substrate, a readout circuit 11, an information processing circuit 12 which includes an information processing circuit memory and an arithmetic processing unit, a gate drive circuit 13, and a power supply circuit 14.

In FIG. 1, the pixels 1 in the pixel unit 10 are arranged in a 4×6 matrix for the sake of description. However, the arrangement is not limited thereto. Practically, more pixels 1 are arranged in the pixel unit 10. For example, approximately 3000 pixels 1 are arranged in each row and each column in the pixel unit 10. A pixel set 2 includes two adjacent pixels. In FIG. 1, the pixel set 2 includes a first pixel 1*a* and a second pixel 1*b*. Moreover, the pixel set 2 is repeatedly arranged in a periodic manner in a direction in which the first pixel 1*a* and the second pixel 1*b* are adjacent to each other.

A signal line 15 is wiring to read out a signal acquired by the pixel 1 to the readout circuit 11. As illustrated in FIG. 1, two pixels 1 adjacent to each other, that is, the first pixel 1*a* and the second pixel 1*b*, are connected to one signal line 15.

A drive line 16 is wiring to supply a signal to turn on a switch element included in the pixel 1. The first pixel 1*a* and the second pixel 1*b* are connected to separate drive lines 16. That is, the first pixel 1*a* is connect to a first drive line 16*a*, whereas the second pixel 1b is connected to a second drive line 16b. A bias line 17 is wiring to supply a bias voltage to each pixel 1 of the pixel unit 10.

Figure 2:
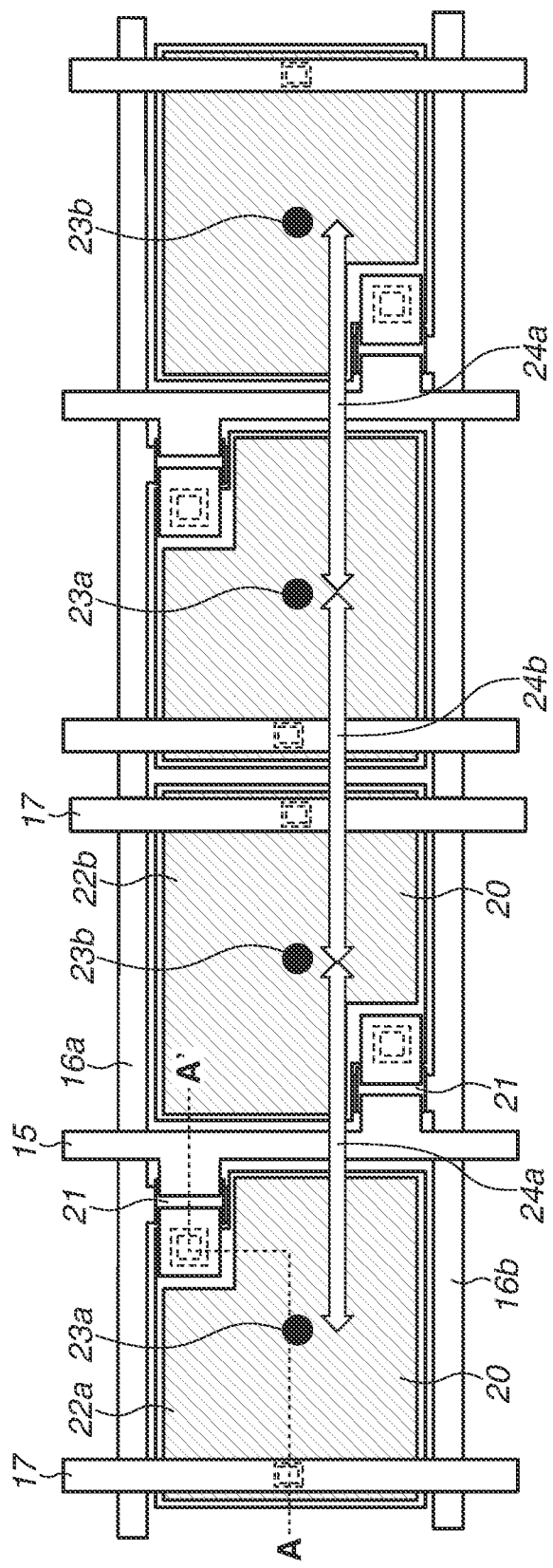
FIG. 2 is a plan view illustrating pixels according to the first embodiment.

FIG. 2 is a plan view illustrating the pixels 1 according to the first embodiment. In FIG. 2, a first pixel set and a second pixel set that are adjacently arranged in a row direction in the pixel unit 10 is illustrated. That is, four pixels are illustrated in FIG. 2. A scintillator that converts radiation into light is disposed above the pixel 1 although the scintillator is omitted in FIG. 2. The light converted by the scintillator is converted into an electric charge by a photoelectric conversion element 20, and the electric charge is transferred as an electric signal to the signal line 15 via the switch element.

The pixel 1 includes the photoelectric conversion element 20 and a thin film transistor (TFT) 21 that is used as a switch element. In addition, various kinds of wiring, such as the signal line 15, the drive line 16, and the bias line 17, is arranged on the pixel 1 to drive the pixel 1 and read out a signal.

The signal from the photoelectric conversion element 20 is transferred to the signal line 15 via the TFT 21. The first drive line 16a and the second drive line 16b control ON/OFF of the TFT 21. The bias line 17 is connected to an upper electrode of the photoelectric conversion element 20.

The photoelectric conversion element 20 includes a light shield portion in which light is shielded by the bias line 17.

Accordingly, as for a shape of an aperture portion (a shaded area in FIG. 2) that can receive light, a shape of an aperture portion 22a of the first pixel 1a differs from a shape of an aperture portion 22b of the second pixel 1b. Herein, the aperture portion 22a of the first pixel 1a has a gravity center 23a, and the aperture portion 22b of the second pixel 1b has a gravity center 23b. In this case, a first gravity-center-to-gravity-center distance 24a and a second gravity-center-to-gravity-center distance 24b are provided. The first gravity-center-to-gravity-center distance 24a is a distance between gravity centers of adjacent pixels with the signal line 15 arranged between the adjacent pixels, whereas the second gravity-center-to-gravity-center distance 24b is a distance between gravity centers of adjacent pixels without the signal line 15 arranged between the adjacent pixels.

In the present embodiment, the first gravity-center-to-gravity-center distance 24a and the second gravity-center-to-gravity-center distance 24b are substantially the same. The TFT 21 connected to the first pixel 1a is disposed on the side of the signal line 15 relative to the gravity center 23a. The arrangement of the TFT 21 on the side of the signal line 15 reduces an area of the aperture portion 22a/22b by an area for the arrangement of the TFT 21. This causes the gravity center of the aperture portion 22a/22b to be farther from the signal line 15.

Accordingly, the light shield portion in which light on the aperture portion 22a/22b is shielded by the bias line 17 is arranged on the side opposite the signal line 15 with the gravity center 23a therebetween, so that the gravity center of the aperture portion 22a/22b is provided nearer to the signal line 15. Accordingly, a distance between the gravity centers is adjusted, and thus the first gravity-center-to-gravity-center distance 24a and the second gravity-center-to-gravity-center distance 24b can match each other.

Regarding the situation in which the first gravity-center-to-gravity-center distance 24a and the second gravity-center-to-gravity-center distance 24b are substantially the same, the first gravity-center-to-gravity-center distance 24a and the second gravity-center-to-gravity-center distance 24b are desirably within 5% from an average value of the first gravity-center-to-gravity-center distance 24a and the second gravity-center-to-gravity-center distance 24b, and more desirably within 2% from an average value of the first gravity-center-to-gravity-center distance 24a and the second gravity-center-to-gravity-center distance 24b.

If a first gravity-center-to-gravity-center distance 24a and a second gravity-center-to-gravity-center distance 24b are substantially the same, it can be considered that a period having a gravity center of a pixel with respect to a row direction is generally the first gravity-center-to-gravity-center distance 24a only. On the other hand, if a difference in values between a first gravity-center-to-gravity-center distance 24a and a second gravity-center-to-gravity-center distance 24b is greater, a long period that is addition of the first gravity-center-to-gravity-center distance 24a and the second gravity-center-to-gravity-center distance 24b may be generated as a period having a gravity center of a pixel with respect to a row direction.

In pixel arrangement by which such a long period is generated, consider a case where radiographic imaging using grids is performed. In this case, complex moire in which two types of moire overlap one another occurs. The two types of moire are influenced by an average period of the first gravity-center-to-gravity-center distance 24a and the second gravity-center-to-gravity-center distance 24b and a long period that is addition of the first gravity-center-to-gravity-center distance 24a and the second gravity-center-to-gravity-center distance 24b.

In a case where complex moire occurs, image processing is difficult. Consequently, image quality may be degraded.

According to the present embodiment, on the other hand, in pixel arrangement in which a first gravity-center-to-gravity-center distance 24a and a second gravity-center-to-gravity-center distance 24b are substantially the same, moire due to only the first gravity-center-to-gravity-center distance 24a occurs. Thus, the moire is simpler. The simpler the moire, the easier the image processing. Hence, image quality can be enhanced.

The gravity center in the present disclosure is determined by dividing an aperture portion into segments each having an optional shape, and then dividing a total sum of addition of position moments and areas of the segments by a total sum of the areas.

In addition, if centers of aperture portions are the same, the similar effects are provided. The term "center" used in the present disclosure represents a position in which an aperture portion is divided into four equal parts by two lines not only passing through the center but also parallel to a row and a column. The present embodiment has been described using a gravity center and a gravity-center-to-gravity-center distance. However, the similar phenomenon occurs even in a case where a center and a center-to-center distance are used.

Figure 3:
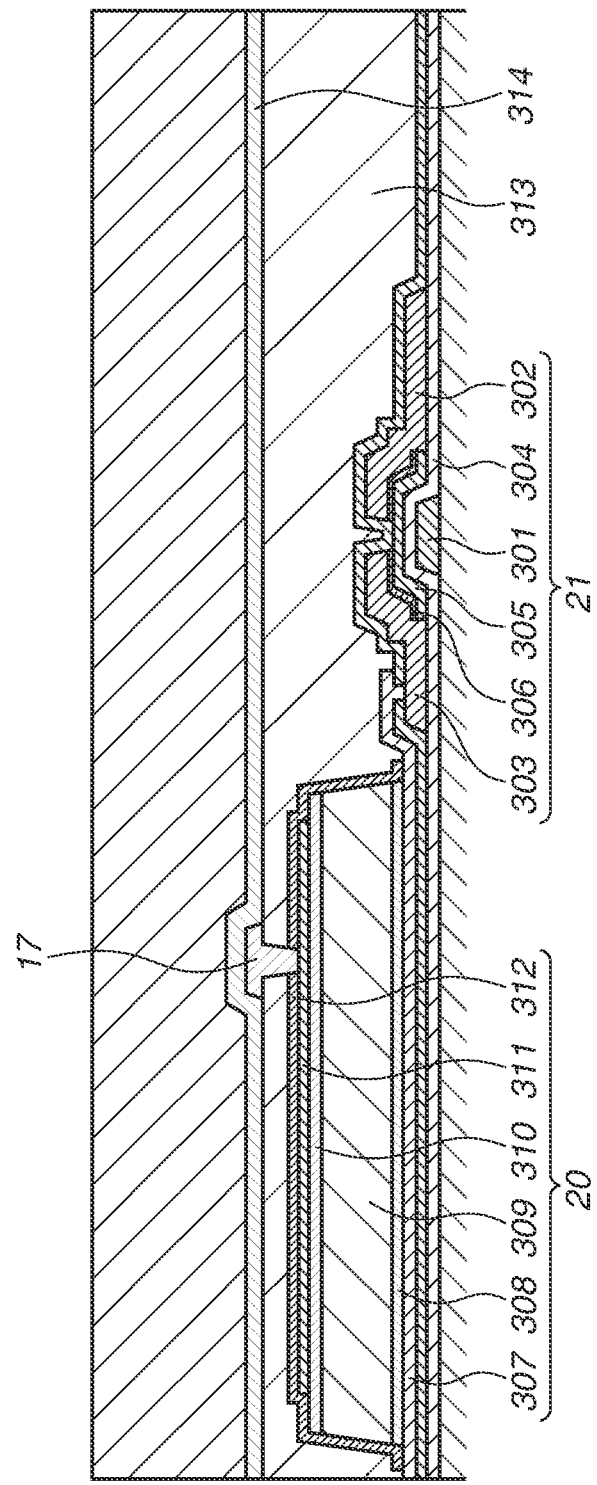
FIG. 3 is a sectional view illustrating the pixel according to the first embodiment.

FIG. 3 is a sectional view along the line A-A' of FIG. 2. The photoelectric conversion element 20 is disposed on the left, and the TFT 21 is disposed on the right. The TFT 21 includes a gate electrode 301, a source electrode 302, a drain electrode 303, an insulation layer 304, a first semiconductor layer 305, and a first impurity semiconductor layer 306.

The photoelectric conversion element 20 includes an individual electrode 307, a second impurity semiconductor layer 308, a second semiconductor layer 309, a third impurity semiconductor layer 310, a common electrode 311, and a protection layer 312.

The drain electrode 303 is connected to the individual electrode 307 by contact. The common electrode 311 is connected to the bias line 17 by contact. The gate electrode 301 of the TFT 21 serves as one portion of the first drive line 16a, and the source electrode 302 serves as one portion of the signal line 15. The TFT 21 is turned on by the first drive line 16a, so that an electric charge of the photoelectric conversion element 20 is transferred as an electric signal to the signal line 15.

A light shielding layer including metal may be arranged above the TFT 21 to reduce influence of light to be emitted to the TFT 21. A light shielding layer may include a metal layer that is the same as that of the bias line 17. In such a case, the light shielding layer and the bias line 17 can be connected.

Next, a second embodiment of the present disclosure is described. In the second embodiment, redundant descriptions of the first embodiment are omitted.

A circuit arrangement of a radiation imaging apparatus 100 according to the second embodiment is similar to that of the first embodiment illustrated in FIG. 1.

Figure 4:
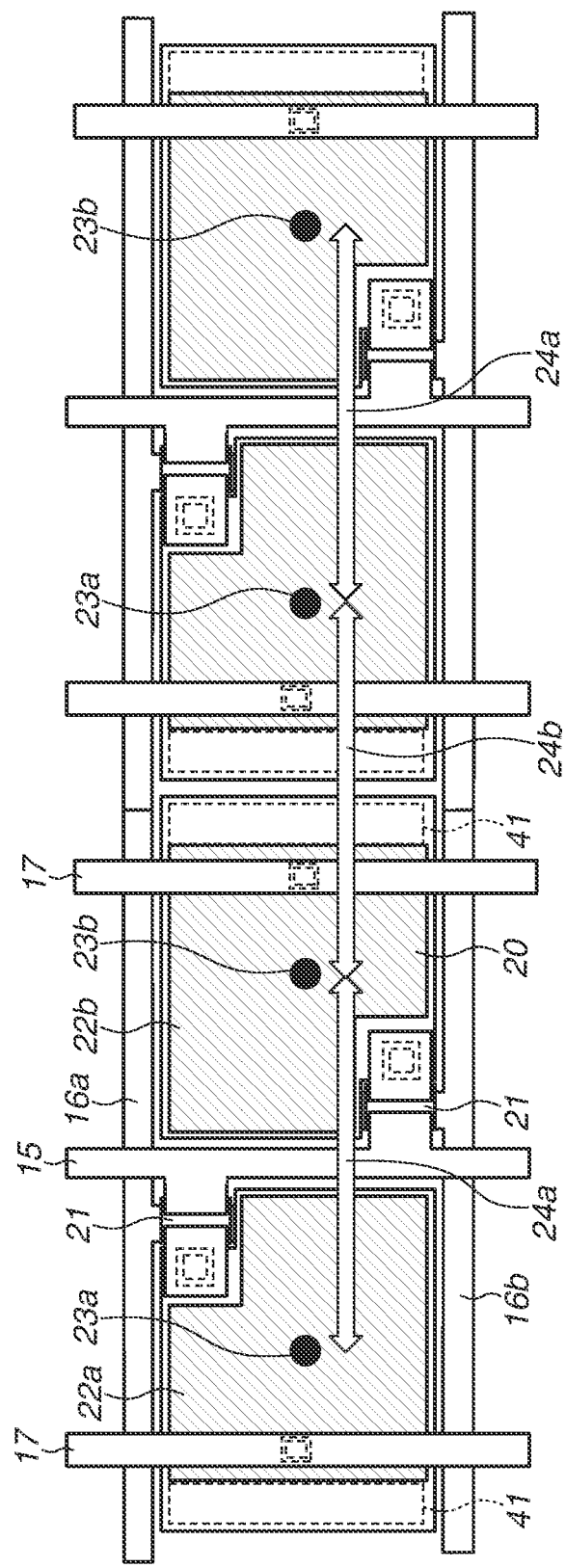
FIG. 4 is a plan view illustrating pixels according to a second embodiment.

FIG. 4 is a plan view illustrating pixels 1 according to the present embodiment. The present embodiment differs from the first embodiment in including an elimination portion 41 in a photoelectric conversion element 20. The photoelectric conversion element 20 has the elimination portion 41 in which a photoelectric conversion layer is eliminated.

Similar to the light shield portion described in the first embodiment, the elimination portion 41 is arranged on the side opposite a signal line 15 with a gravity center 23a therebetween, so that a gravity center of an aperture portion 22a/22b is provided nearer to the signal line 15.

Accordingly, a distance between gravity centers is adjusted, so that a first gravity-center-to-gravity-center distance 24a and a second gravity-center-to-gravity-center distance 24b can match each other.

As a result, in the present embodiment, moire that occurs in radiographic imaging using grids is simplified, as similar to the first embodiment.

The present embodiment has been described using a gravity center and a gravity-center-to-gravity-center distance, as similar to the first embodiment. However, the similar phenomenon occurs even in a case where a center and a center-to-center distance are used.

Next, a third embodiment of the present disclosure is described. In the third embodiment, redundant descriptions of the first embodiment are omitted.

Figure 5:
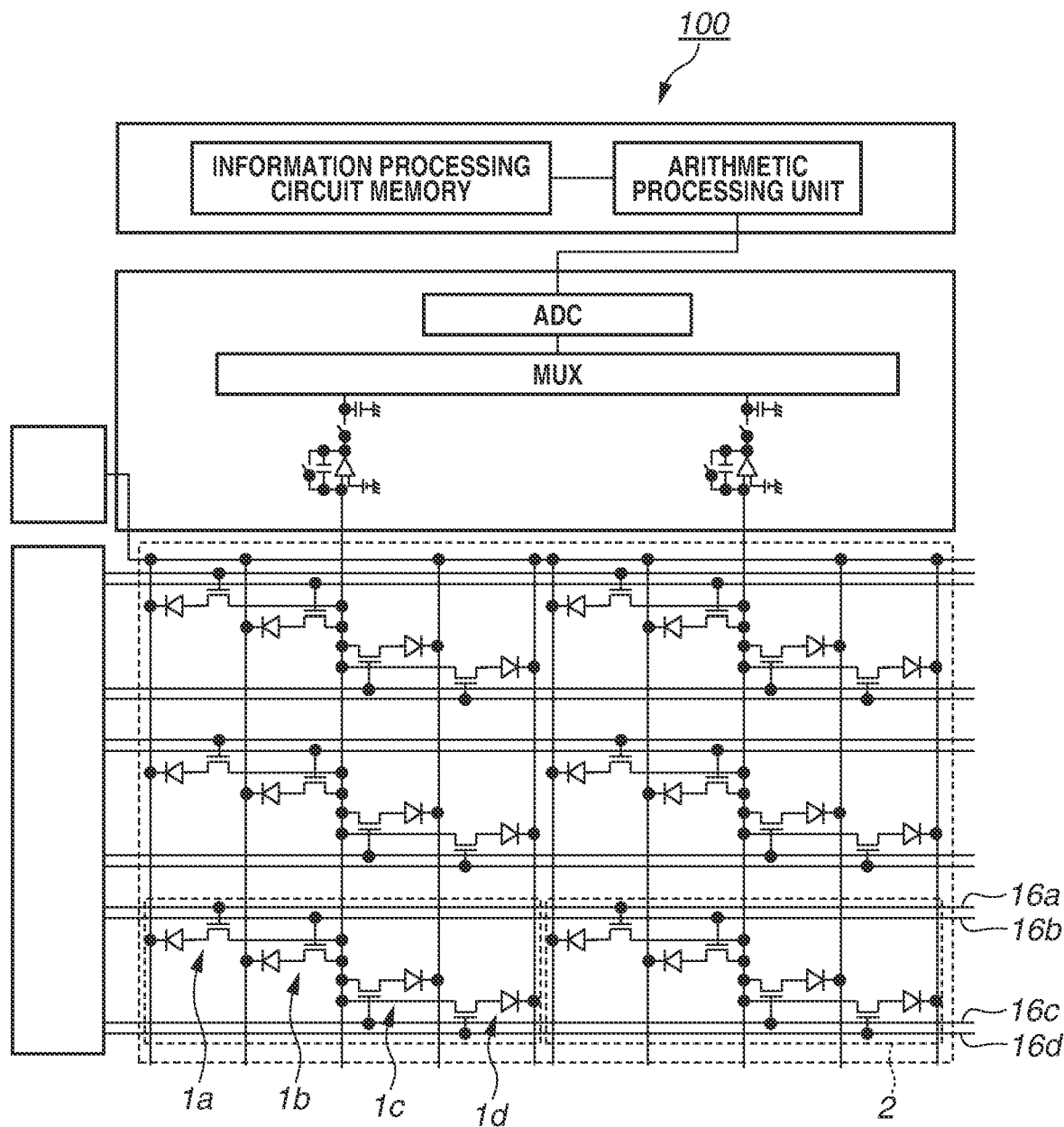
FIG. 5 is an equivalent circuit diagram illustrating circuit arrangement of a radiation imaging apparatus according to a third embodiment.

FIG. 5 is an equivalent circuit diagram illustrating circuit arrangement of a radiation imaging apparatus 100 according to the present embodiment. The radiation imaging apparatus 100 of the present embodiment differs from that of the first embodiment in that four pixels sequentially arranged in a row direction are connected to one signal line 15. That is, a first pixel 1a, a second pixel 1b, a third pixel 1c, and a fourth pixel 1d are connected to one signal line 15.

These four pixels are connected to different drive lines 16. That is, the first pixel 1a, the second pixel 1b, the third pixel 1c, and the fourth pixel 1d are respectively connected to a first drive line 16a, a second drive line 16b, a third drive line 16c, and a fourth drive line 16d. In addition, each of the pixels 1a, 1b, 1c, and 1d is connected to a bias line 17.

A pixel set 2 includes the four pixels of the first pixel 1a, the second pixel 1b, the third pixel 1c, and the fourth pixel 1d, and is repeatedly arranged in a periodic manner in a row direction. That is, a first pixel set includes the first pixel 1a, the second pixel 1b, the third pixel 1c, and the fourth pixel 1d which are sequentially arranged, and a second pixel set includes four pixels that are sequentially arranged from the right of the fourth pixel 1d. Shapes of aperture portions 22a/22b in a pixel set differ from one another, as similar to the description with reference to FIG. 2. Even in a case where such four adjacent pixels in a row direction are connected to one signal line, a shape of a light shield portion or an elimination portion is adjusted, so that each of gravity-center-to-gravity-center distances of the pixels is matched. Thus, moire that occurs in radiographic imaging using grids can be simplified.

In addition, even in a case where a number of pixels in a pixel set 2 is other than two or four, moire can be simplified by the similar method. The present embodiment has been described using a gravity center and a gravity-center-to-gravity-center distance, as similar to the first embodiment. However, the similar phenomenon occurs even in a case where a center and a center-to-center distance are used.

In addition, even in a case where a pixel set 2 includes pixels that are adjacently arranged in a column direction, moire can be simplified by the similar method. That is, in a case where a pixel set 2 in which a plurality of pixels is adjacent in a certain direction is repeatedly arranged in a periodic manner in a direction in which the pixels of the pixel set 2 are adjacent, moire can be simplified by the method according to the present embodiment.

Next, a fourth embodiment of the present disclosure is described. In the fourth embodiment, redundant descriptions of the first embodiment are omitted.

A circuit arrangement of a radiation imaging apparatus 100 according to the fourth embodiment is similar to that of the first embodiment illustrated in FIG. 1.

Figure 6:
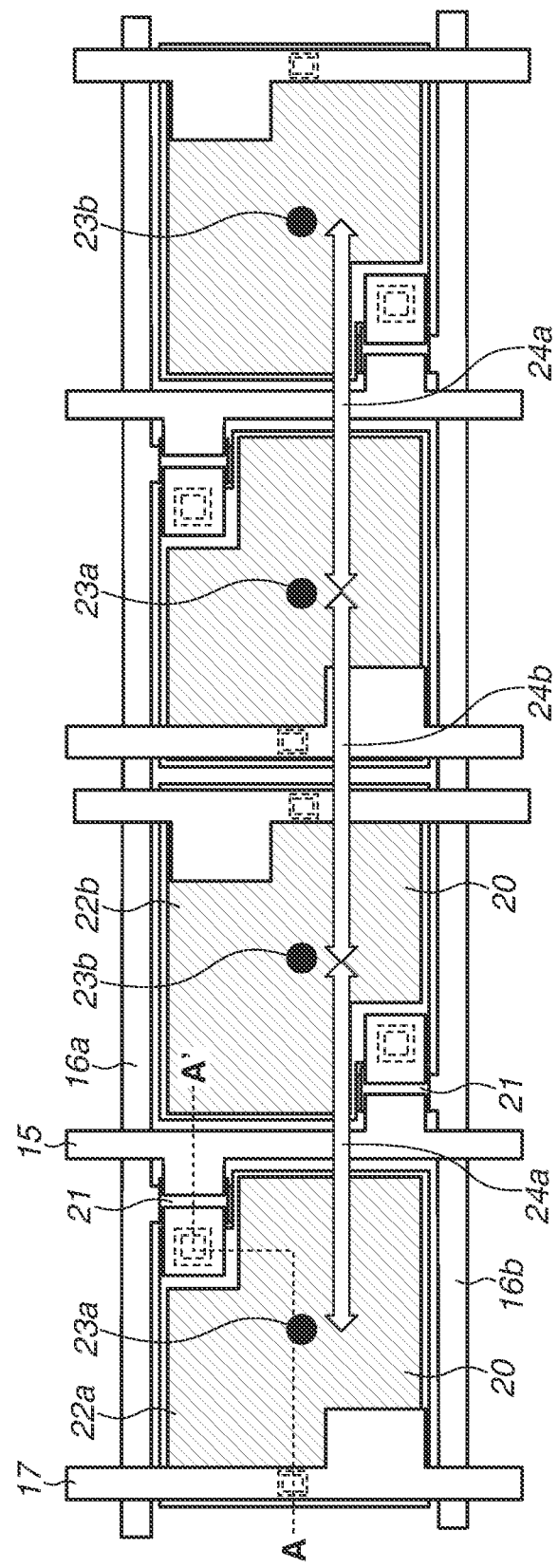
FIG. 6 is a plan view illustrating pixels according to a fourth embodiment.

FIG. 6 is a plan view illustrating pixels 1 according to the fourth embodiment. In the present embodiment, a shape of a bias line 17 differs from that of the first embodiment. An aperture portion 22a of a first pixel 1a in the present embodiment has a shape that is substantially point-symmetrical with respect to a gravity center 23a of the aperture portion 22a of the first pixel 1a. In radiographic imaging using grids, such a substantially point-symmetrical shape enables moire to be simplified with respect to any direction.

The present embodiment has been described using a gravity center and a gravity-center-to-gravity-center distance, as similar to the first embodiment. However, the similar phenomenon occurs even in a case where a center and a center-to-center distance are used.

Figure 7:
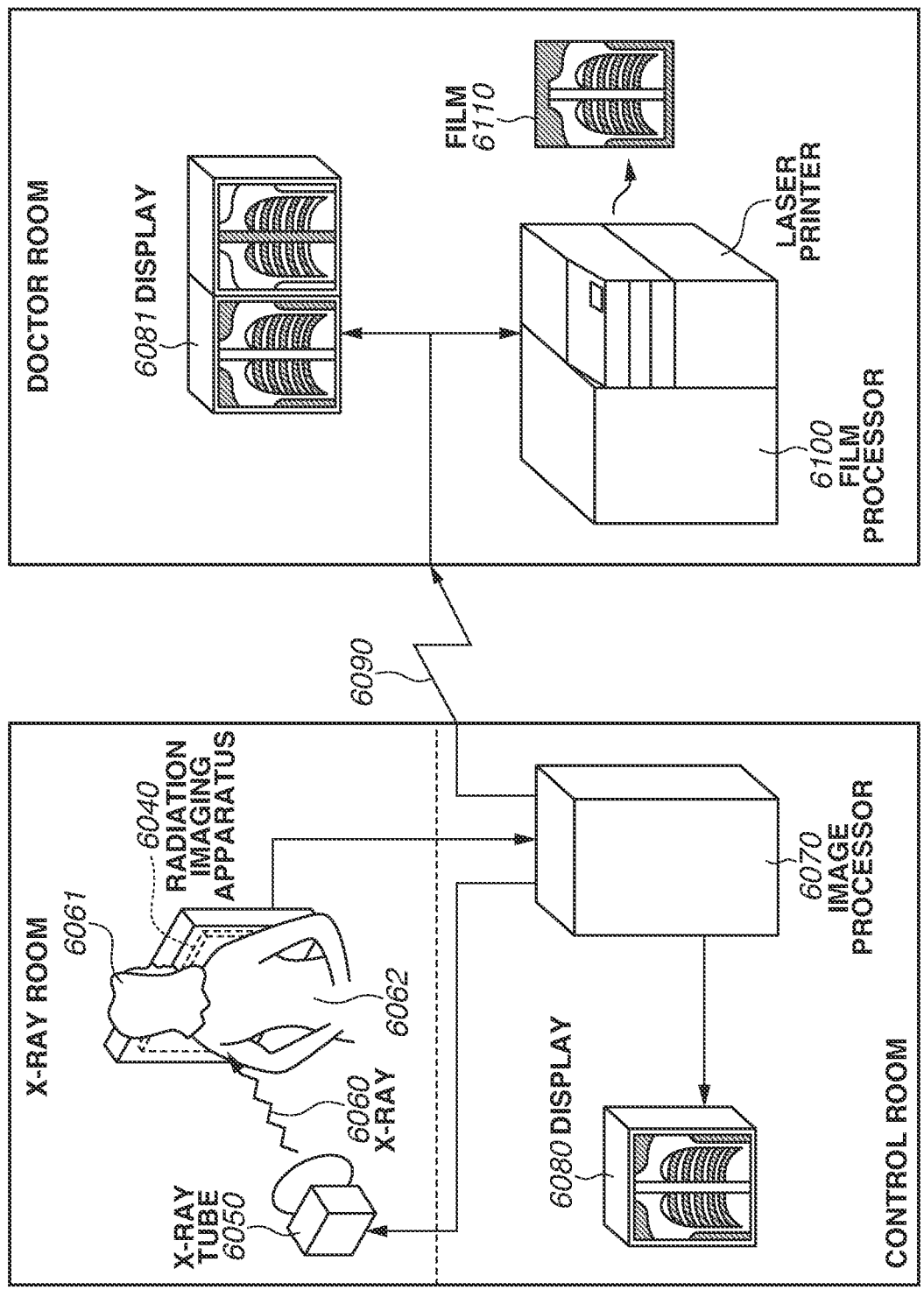
FIG. 7 is a diagram illustrating a configuration example of a radiation imaging system according to a fifth embodiment.

Hereinafter, an example in which the radiation imaging apparatus 100 of any of the above embodiments is applied to a radiation imaging system is described with reference to FIG. 7. An X-ray 6060 generated by an X-ray tube 6050 that is a radiation source is transmitted to a chest 6062 of a patient or a subject 6061, and then enters into a radiation imaging apparatus 6040 typified by the above-described radiation imaging apparatus 100. The X-ray 6060 which has entered into the radiation imaging apparatus 6040 contains information about an internal body of the subject 6061.

A scintillator emits light in response to the incidence of the X-ray, and the light is photoelectrically converted by a photoelectric conversion element to acquire electrical information. Such information is digitally converted, and the resultant digital information is processed as a radiation image by an image processor 6070 that is a signal processing unit. Then, the radiation image can be observed on a display 6080 that is a display unit in a control room.

In addition, such information can be transferred to a remote location by a transmission processing unit such as a telephone line 6090. Thus, the information can be displayed on a display 6081 that is a display unit in a doctor room of another location, or can be stored in a recording unit such as an optical disk, so that a physician in a remote location can make a diagnosis. Moreover, the information can be recorded in a film 6110 that is a recoding medium by a film processor 6100 that is a recording unit.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2022-056593, filed Mar. 30, 2022, which is hereby incorporated by reference herein in its entirety.

What is claimed is:

1. A radiation imaging apparatus comprising: a pixel unit in which a plurality of pixels each including a photoelectric conversion element configured to convert light into an electric charge and a switch element is arranged in a matrix,
    wherein the pixel unit includes a plurality of pixel sets that are adjacently arranged in a predetermined direction, each of the plurality of pixel sets including two or more of the pixels, which are adjacently arranged in the predetermined direction and in which the photoelectric conversion elements have aperture portions having different shapes, and
    wherein each of the aperture portions has a gravity center or center, and a distance between each of the gravity centers or the centers for adjacent pixels in the plurality of pixels are substantially the same.

2. The radiation imaging apparatus according to claim 1, wherein the plurality of pixel sets include:
    a first pixel set including a first pixel and a second pixel adjacent to the first pixel in the predetermined direction; and
    a second pixel set including a third pixel adjacent to the second pixel in the predetermined direction and a fourth pixel adjacent to the third pixel in the predetermined direction, and
    wherein, in the pixel unit, the first pixel, the second pixel, the third pixel, and the fourth pixel are arranged such that a first distance, a second distance, and a third distance are substantially the same, the first distance being a distance between a gravity center or a center of the aperture portion the first pixel and a gravity center or a center of the aperture portion of the second pixel, the second distance being a distance between the gravity center or the center of the aperture portion of the second pixel and a gravity center or a center of the aperture portion of the third pixel, and the third distance being a distance between the gravity center or the center of the aperture portion of the third pixel and a gravity center or a center of the aperture portion of the fourth pixel.

3. The radiation imaging apparatus according to claim 2, wherein the first distance, the second distance, and the third distance are within 5% from an average value of the first distance, the second distance, and the third distance.

4. The radiation imaging apparatus according to claim 2, further comprising:
    a signal line configured to read out a signal acquired by the photoelectric conversion element; and
    a drive line configured to supply a signal to turn on the switch element,
    wherein the first pixel set in the plurality of pixel sets and the second pixel set which is in the plurality of pixel sets and adjacent to the first pixel set in the predetermined direction are connected to a common signal line or drive lines.

5. The radiation imaging apparatus according to claim 4, comprising a light shield portion arranged on the aperture portion and configured to shield one portion of the photoelectric conversion element from light.

6. The radiation imaging apparatus according to claim 5, wherein the light shield portion is arranged opposite the signal line arranged on the aperture portion with the gravity center of the aperture portion between the light shield portion and the signal line.

7. The radiation imaging apparatus according to claim 5, wherein the light shield portion is a bias line configured to supply to a bias voltage to each of the plurality of pixels.

8. The radiation imaging apparatus according to claim 4, comprising an elimination portion where one portion of the photoelectric conversion element is eliminated.

9. The radiation imaging apparatus according to claim 8, wherein the elimination portion is arranged opposite the signal line arranged on the aperture portion with the gravity center of the aperture portion between the elimination portion and the signal line.

10. A radiation imaging system comprising:
    the radiation imaging apparatus according to claim 1; and
    a signal processing unit configured to process a signal detected by the radiation imaging apparatus as a radiation image.

11. A radiation imaging apparatus comprising:
    a pixel unit in which a plurality of pixels each including a photoelectric conversion element configured to convert light into an electric charge and a switch element is arranged in a matrix;
    a light shield portion arranged on an aperture portion of the photoelectric conversion elements of each pixel and configured to shield one portion of the photoelectric conversion elements of each pixel from light; and
    a signal line configured to read out a signal acquired by the photoelectric conversion elements of each pixel,
    wherein the pixel unit includes a first pixel set and a second pixel set that are adjacently arranged in a predetermined direction, each of the first pixel set and the second pixel set including two or more of the pixels which are adjacently arranged in the predetermined direction and in which the photoelectric conversion elements of each pixel have aperture portions having different shapes, and
    wherein the light shield portion is arranged opposite the signal line arranged on the aperture portion with a gravity center of the aperture portion between the light shield portion and the signal line.

12. A radiation imaging apparatus comprising:
    a pixel unit in which a plurality of pixels each including a photoelectric conversion element configured to convert light into an electric charge and a switch element is arranged in a matrix;
    an elimination portion where one portion of the photoelectric conversion element is eliminated; and
    a signal line configured to read out a signal acquired by the photoelectric conversion element,
    wherein the pixel unit includes a first pixel set and a second pixel set that are adjacently arranged in a predetermined direction, each of the first pixel set and the second pixel set including two or more of the pixels which are adjacently arranged in the predetermined direction and in which the photoelectric conversion elements of each pixel have aperture portions having different shapes, and
    wherein the elimination portion is arranged opposite the signal line arranged on the aperture portion with a gravity center of the aperture portion between the elimination portion and the signal line.

\* \* \* \* \*